US012665524B2

(12) United States Patent
Peker

(10) Patent No.: US 12,665,524 B2
(45) Date of Patent: Jun. 23, 2026

(54) IDEAL DIODE BRIDGE CONTROLLER

(71) Applicant: MICROCHIP TECHNOLOGY INCORPORATED, Chandler, AZ (US)

(72) Inventor: Arkadiy Peker, Glen Cove, NY (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 295 days.

(21) Appl. No.: 18/483,956

(22) Filed: Oct. 10, 2023

(65) Prior Publication Data

US 2024/0388219 A1     Nov. 21, 2024

Related U.S. Application Data

(60) Provisional application No. 63/467,456, filed on May 18, 2023.

(51) Int. Cl.
H02M 7/219     (2006.01)
H02M 1/00     (2007.01)
(Continued)

(52) U.S. Cl.
CPC ......... H02M 7/219 (2013.01); H02M 1/0012 (2021.05); H03K 17/06 (2013.01); H03K 17/687 (2013.01)

(58) Field of Classification Search
CPC ...... H02M 7/219; H02M 1/0012; H02M 1/08; H03K 17/06; H03K 17/687; H03K 2017/307
(Continued)

(56) References Cited

U.S. PATENT DOCUMENTS 6,324,084 B1     11/2001 Fujisawa
8,804,389 B2 *     8/2014 Heath ..................... H02M 1/38
363/127

(Continued)

FOREIGN PATENT DOCUMENTS

EP          1067667 A1     1/2001

OTHER PUBLICATIONS

Wang et al., "Active Bridge Rectifier with DM EMI Reduction Based on Linear Reverse Operation of MOSFETs", IEEE Transactions on Power Electronics, vol. 36, No. 3, Aug. 2020, pp. 1-11.
(Continued)

*Primary Examiner* — Thienvu V Tran
*Assistant Examiner* — Lauren Ashley Shaw
(74) *Attorney, Agent, or Firm* — Shumaker, Loop & Kendrick, LLP; Ryan M. Corbett

(57)          ABSTRACT

An ideal diode bridge controller is provided that includes gate drivers to connect to transistors of a bridge rectifier in which the transistors are arranged as high-side transistors and low-side transistors. The gate drivers alternately switch the transistors to cause the bridge rectifier to convert an input voltage of either of two polarities to an output voltage of one of the two polarities. The gate drivers include low-side gate drivers for the low-side transistors, and respective ones of the low-side gate drivers include linear drive circuitry and digital drive circuitry. The linear drive circuitry drives a respective low-side transistor to switch on and off based on forward current through the respective low-side transistor. The digital drive circuitry detects a reverse current through the respective low-side transistor, and causes the respective low-side transistor to switch off in response to the reverse current.

18 Claims, 11 Drawing Sheets

(51) Int. Cl.
*H03K 17/06*          (2006.01)
*H03K 17/687*          (2006.01)

(58) Field of Classification Search
USPC .......................................................... 363/127
See application file for complete search history.

(56)                    References Cited

U.S. PATENT DOCUMENTS

| | | | | |
|---|---|---|---|---|
| 8,913,409 | B2 * | 12/2014 | Hui ....................... | H02M 7/219 |
| | | | | 363/127 |
| 2013/0235635 | A1 * | 9/2013 | Takahagi .................. | H02J 7/02 |
| | | | | 363/127 |

OTHER PUBLICATIONS

International Search Report and Written Opinion dated Jan. 24, 2024 in International Application No. PCT/ US2023/078681 filed Nov. 3, 2023.
International Preliminary Report on Patentability issued on Nov. 13, 2025 in corresponding International Application No. PCT/US2023/078681 (9 pages).

* cited by examiner

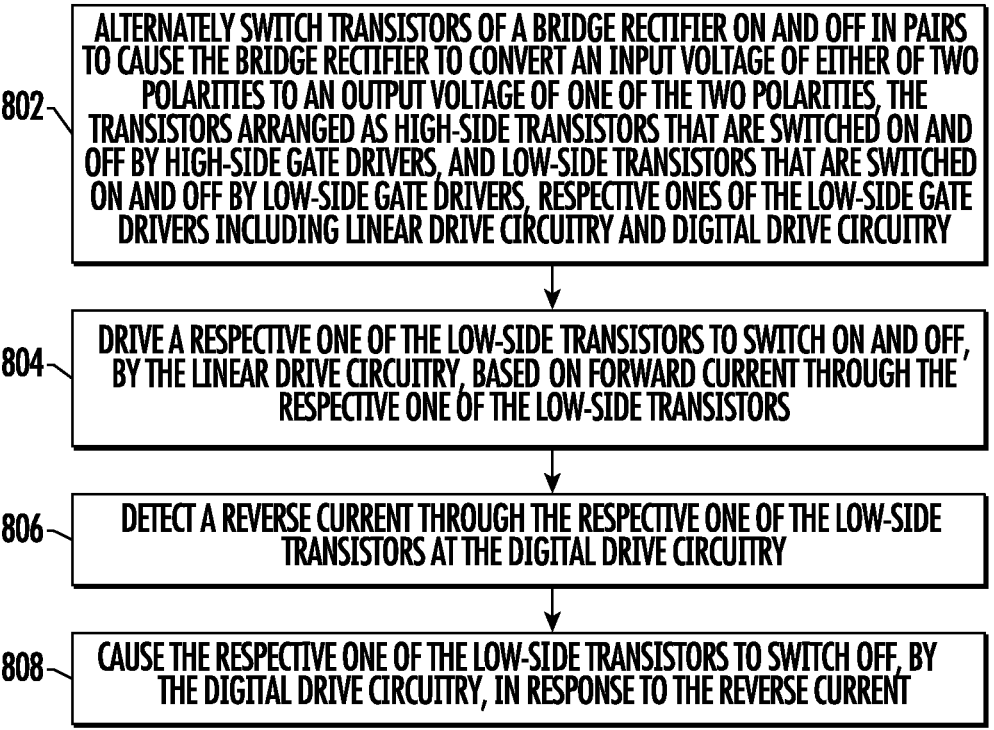

800

802 — ALTERNATELY SWITCH TRANSISTORS OF A BRIDGE RECTIFIER ON AND OFF IN PAIRS TO CAUSE THE BRIDGE RECTIFIER TO CONVERT AN INPUT VOLTAGE OF EITHER OF TWO POLARITIES TO AN OUTPUT VOLTAGE OF ONE OF THE TWO POLARITIES, THE TRANSISTORS ARRANGED AS HIGH-SIDE TRANSISTORS THAT ARE SWITCHED ON AND OFF BY HIGH-SIDE GATE DRIVERS, AND LOW-SIDE TRANSISTORS THAT ARE SWITCHED ON AND OFF BY LOW-SIDE GATE DRIVERS, RESPECTIVE ONES OF THE LOW-SIDE GATE DRIVERS INCLUDING LINEAR DRIVE CIRCUITRY AND DIGITAL DRIVE CIRCUITRY

804 — DRIVE A RESPECTIVE ONE OF THE LOW-SIDE TRANSISTORS TO SWITCH ON AND OFF, BY THE LINEAR DRIVE CIRCUITRY, BASED ON FORWARD CURRENT THROUGH THE RESPECTIVE ONE OF THE LOW-SIDE TRANSISTORS

806 — DETECT A REVERSE CURRENT THROUGH THE RESPECTIVE ONE OF THE LOW-SIDE TRANSISTORS AT THE DIGITAL DRIVE CIRCUITRY

808 — CAUSE THE RESPECTIVE ONE OF THE LOW-SIDE TRANSISTORS TO SWITCH OFF, BY THE DIGITAL DRIVE CIRCUITRY, IN RESPONSE TO THE REVERSE CURRENT

FIG. 8A

810 — SELECTIVELY ENABLE AND DISABLE THE HIGH-SIDE GATE DRIVERS AND THE LOW-SIDE GATE DRIVERS, INCLUDING SELECTIVELY ENABLE AND DISABLE THE LINEAR DRIVE CIRCUITRY AND THE DIGITAL DRIVE CIRCUITRY OF THE RESPECTIVE ONES OF THE LOW-SIDE GATE DRIVERS

FIG. 8B

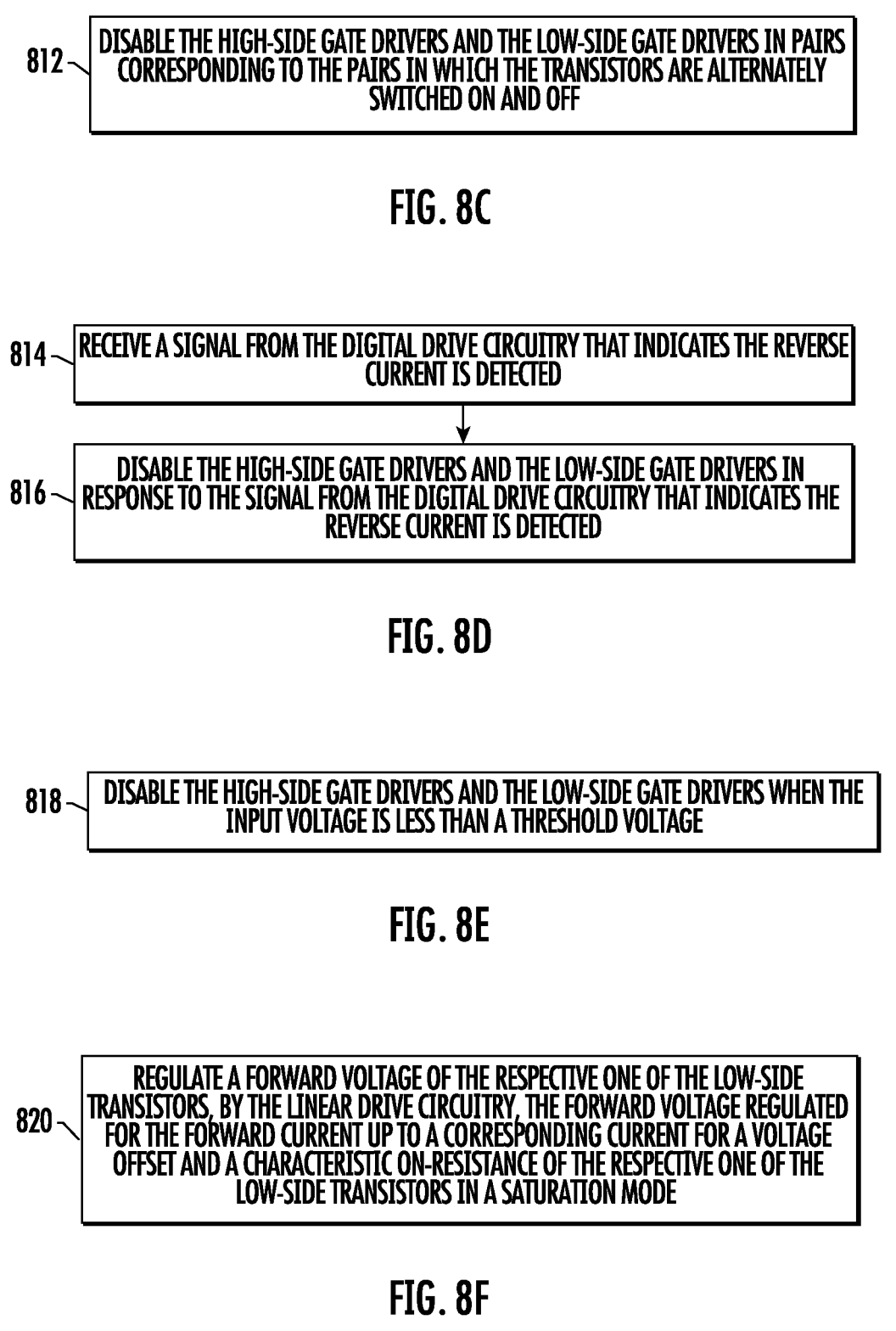

812 ~ | DISABLE THE HIGH-SIDE GATE DRIVERS AND THE LOW-SIDE GATE DRIVERS IN PAIRS CORRESPONDING TO THE PAIRS IN WHICH THE TRANSISTORS ARE ALTERNATELY SWITCHED ON AND OFF

FIG. 8C

814 ~ | RECEIVE A SIGNAL FROM THE DIGITAL DRIVE CIRCUITRY THAT INDICATES THE REVERSE CURRENT IS DETECTED

816 ~ | DISABLE THE HIGH-SIDE GATE DRIVERS AND THE LOW-SIDE GATE DRIVERS IN RESPONSE TO THE SIGNAL FROM THE DIGITAL DRIVE CIRCUITRY THAT INDICATES THE REVERSE CURRENT IS DETECTED

FIG. 8D

818 ~ | DISABLE THE HIGH-SIDE GATE DRIVERS AND THE LOW-SIDE GATE DRIVERS WHEN THE INPUT VOLTAGE IS LESS THAN A THRESHOLD VOLTAGE

FIG. 8E

820 ~ | REGULATE A FORWARD VOLTAGE OF THE RESPECTIVE ONE OF THE LOW-SIDE TRANSISTORS, BY THE LINEAR DRIVE CIRCUITRY, THE FORWARD VOLTAGE REGULATED FOR THE FORWARD CURRENT UP TO A CORRESPONDING CURRENT FOR A VOLTAGE OFFSET AND A CHARACTERISTIC ON-RESISTANCE OF THE RESPECTIVE ONE OF THE LOW-SIDE TRANSISTORS IN A SATURATION MODE

FIG. 8F

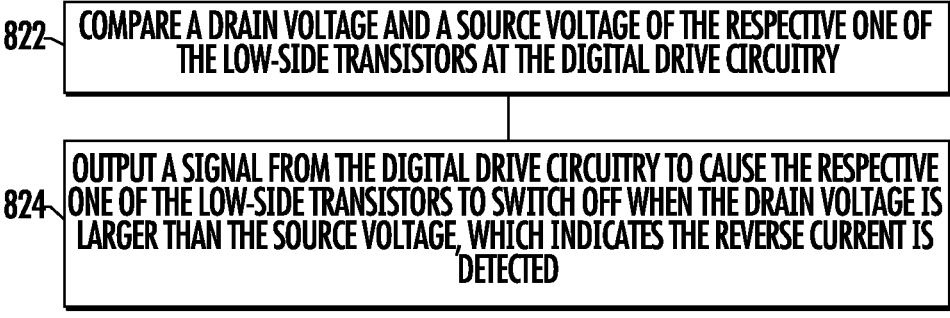

822— COMPARE A DRAIN VOLTAGE AND A SOURCE VOLTAGE OF THE RESPECTIVE ONE OF THE LOW-SIDE TRANSISTORS AT THE DIGITAL DRIVE CIRCUITRY

824— OUTPUT A SIGNAL FROM THE DIGITAL DRIVE CIRCUITRY TO CAUSE THE RESPECTIVE ONE OF THE LOW-SIDE TRANSISTORS TO SWITCH OFF WHEN THE DRAIN VOLTAGE IS LARGER THAN THE SOURCE VOLTAGE, WHICH INDICATES THE REVERSE CURRENT IS DETECTED

FIG. 8G

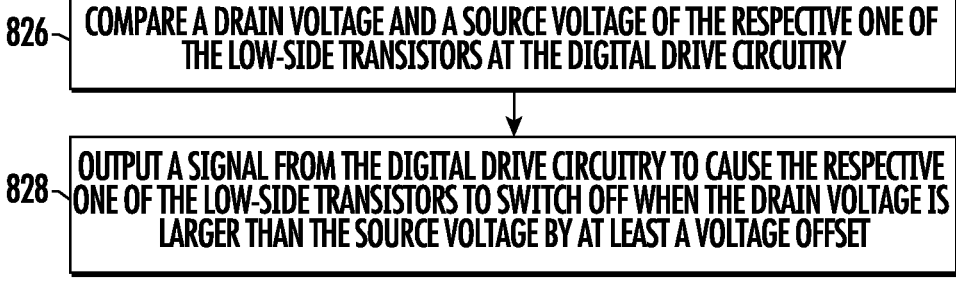

826— COMPARE A DRAIN VOLTAGE AND A SOURCE VOLTAGE OF THE RESPECTIVE ONE OF THE LOW-SIDE TRANSISTORS AT THE DIGITAL DRIVE CIRCUITRY

828— OUTPUT A SIGNAL FROM THE DIGITAL DRIVE CIRCUITRY TO CAUSE THE RESPECTIVE ONE OF THE LOW-SIDE TRANSISTORS TO SWITCH OFF WHEN THE DRAIN VOLTAGE IS LARGER THAN THE SOURCE VOLTAGE BY AT LEAST A VOLTAGE OFFSET

FIG. 8H

830— DRIVE A RESPECTIVE ONE OF THE HIGH-SIDE TRANSISTORS TO SWITCH ON AND OFF, BY THE DIGITAL DRIVE CIRCUITRY, BASED ON FORWARD CURRENT THROUGH THE RESPECTIVE ONE OF THE HIGH-SIDE TRANSISTORS

FIG. 8I

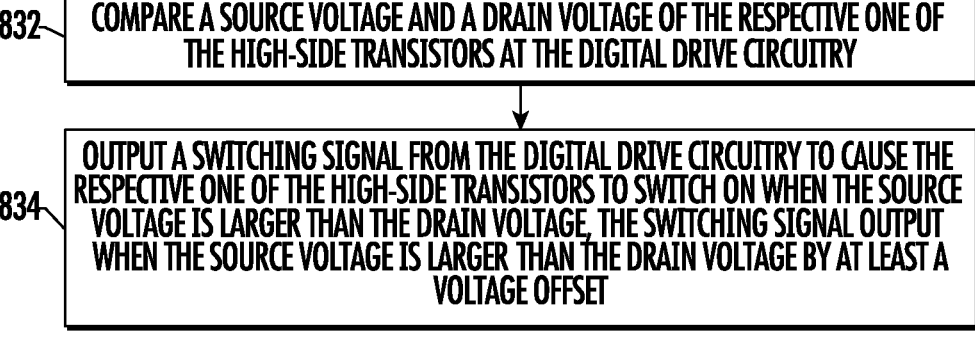

832 — COMPARE A SOURCE VOLTAGE AND A DRAIN VOLTAGE OF THE RESPECTIVE ONE OF THE HIGH-SIDE TRANSISTORS AT THE DIGITAL DRIVE CIRCUITRY

834 — OUTPUT A SWITCHING SIGNAL FROM THE DIGITAL DRIVE CIRCUITRY TO CAUSE THE RESPECTIVE ONE OF THE HIGH-SIDE TRANSISTORS TO SWITCH ON WHEN THE SOURCE VOLTAGE IS LARGER THAN THE DRAIN VOLTAGE, THE SWITCHING SIGNAL OUTPUT WHEN THE SOURCE VOLTAGE IS LARGER THAN THE DRAIN VOLTAGE BY AT LEAST A VOLTAGE OFFSET

FIG. 8J

IDEAL DIODE BRIDGE CONTROLLER

CROSS-REFERENCE TO RELATED APPLICATION(S)

The present application claims priority to U.S. Provisional Patent Application No. 63/467,456, entitled: Ideal Diode Bridge Controller for Power over Ethernet, filed on May 18, 2023, the content of which is hereby incorporated by reference in its entirety.

TECHNOLOGICAL FIELD

The present disclosure relates generally to diode bridges and, in particular, to an ideal diode bridge controller.

BACKGROUND

Power over Ethernet (PoE) is a technology that allows electrical power and data to be transmitted over a standard Ethernet network cable. It eliminates the need for separate power cables, enabling devices to receive both power and network connectivity through a single Ethernet cable.

With PoE, power can be supplied to devices such as IP cameras, wireless access points, VoIP phones, and other networked devices directly through the Ethernet infrastructure. This simplifies the installation and deployment of these devices, especially in situations where power outlets may not be readily available.

PoE operates by using wires in the Ethernet cable to deliver electrical power alongside the data signals. This is accomplished by injecting power into the cable at power sourcing equipment (PSE), which can be a PoE-enabled switch or a PoE injector, which may also be called a midspan device. The power is then extracted at a powered device (PD), which is the device receiving power and data.

There are different versions of PoE. The original PoE standard, also known as IEEE 802.3af, can deliver up to 15.4 watts of power per port. A newer PoE standard, known as IEEE 802.3at, provides higher power delivery of up to 30 watts per port. Another PoE standard, known as IEEE 802.3bt, can deliver even higher power levels, reaching up to 90 watts per port.

BRIEF SUMMARY

The different versions of PoE do not guarantee voltage polarity at a power interface (PI) of the Ethernet cable; and as a consequence, PoE systems generally include a diode bridge to ensure correct polarity at the PD input. The newer versions of PoE have achieved higher power delivery by increasing current, but this has resulted in greater power loss in the diode bridge. The power loss may be reduced with an ideal diode bridge that includes an ideal diode bridge controller connected to a bridge rectifier. In the ideal diode bridge, the diodes of the diode bridge are substituted with transistors that are alternately switched on and off by the ideal diode bridge controller to emulate a diode bridge. Many conventional ideal diode bridge controllers, however, are insufficient for use in in PoE systems.

Example implementations of the present disclosure are directed to diode bridges and, in particular, to an ideal diode bridge controller. The present disclosure includes, without limitation, the following example implementations.

Some example implementations provide an ideal diode bridge controller comprising: gate drivers to connect to transistors of a bridge rectifier in which the transistors are arranged as high-side transistors and low-side transistors, the gate drivers to alternately switch the transistors on and off in pairs to cause the bridge rectifier to convert an input voltage of either of two polarities to an output voltage of one of the two polarities, the gate drivers including high-side gate drivers for the high-side transistors, and low-side gate drivers for the low-side transistors, respective ones of the low-side gate drivers including: linear drive circuitry to drive a respective one of the low-side transistors to switch on and off based on forward current through the respective one of the low-side transistors; and digital drive circuitry to detect a reverse current through the respective one of the low-side transistors, and cause the respective one of the low-side transistors to switch off in response to the reverse current.

Some example implementations provide a method comprising: alternately switching transistors of a bridge rectifier on and off in pairs to cause the bridge rectifier to convert an input voltage of either of two polarities to an output voltage of one of the two polarities, the transistors arranged as high-side transistors that are switched on and off by high-side gate drivers, and low-side transistors that are switched on and off by low-side gate drivers, respective ones of the low-side gate drivers including linear drive circuitry and digital drive circuitry; driving a respective one of the low-side transistors to switch on and off, by the linear drive circuitry, based on forward current through the respective one of the low-side transistors; and at the digital drive circuitry, detecting a reverse current through the respective one of the low-side transistors; and causing the respective one of the low-side transistors to switch off in response to the reverse current.

It will be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

FIGS. 8A, 8B, 8C, 8D, 8E, 8F, 8G, 8H, 8I and 8J are flowcharts illustrating various steps in a method, according to various example implementations.

DETAILED DESCRIPTION

Figure 1:
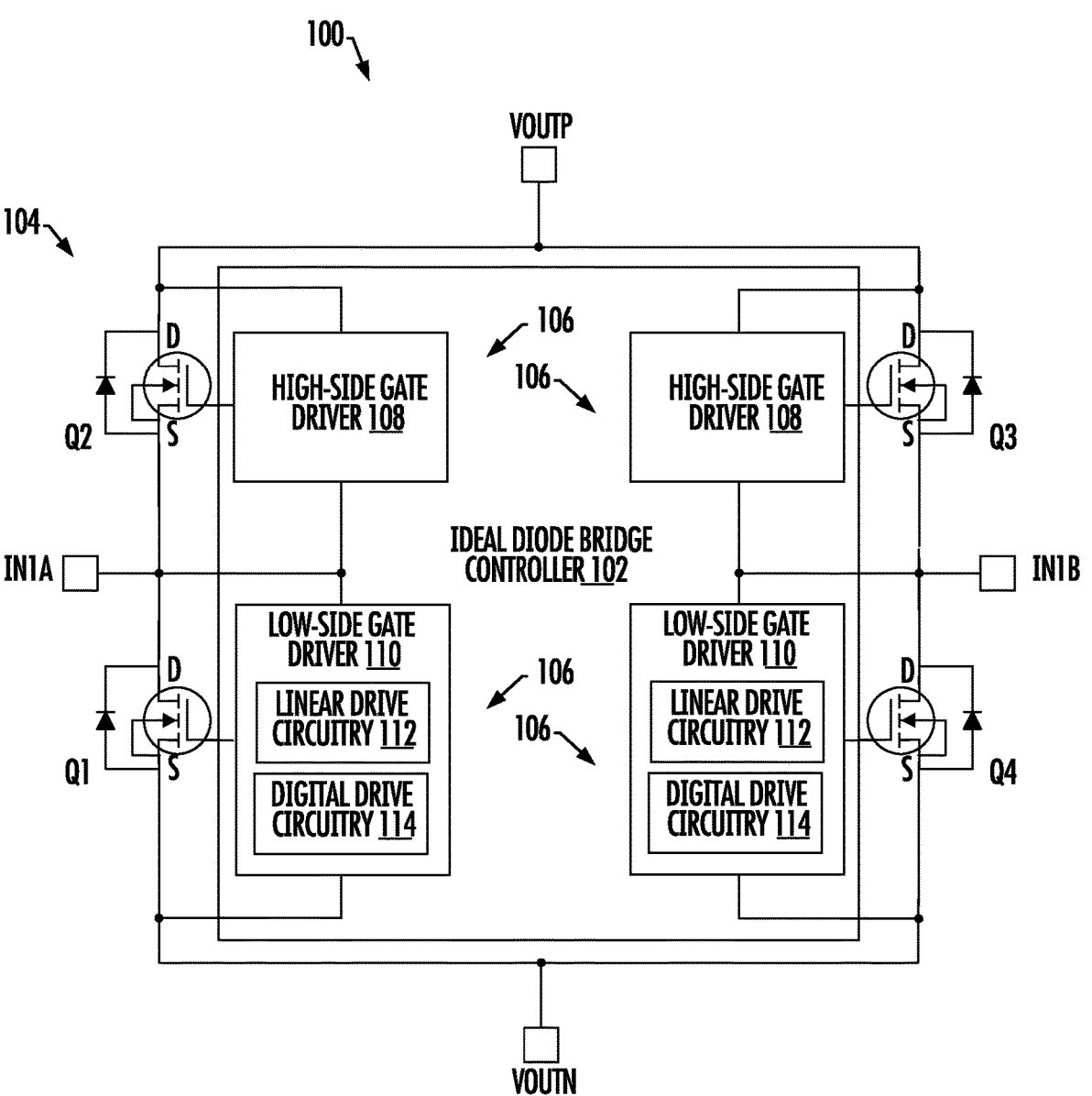
FIG. 1 illustrates an ideal diode bridge controller, according to some example implementations of the present disclosure.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Like reference numerals refer to like elements throughout.

Unless specified otherwise or clear from context, references to first, second or the like should not be construed to imply a particular order. A feature described as being above another feature (unless specified otherwise or clear from context) may instead be below, and vice versa; and similarly, features described as being to the left of another feature else may instead be to the right, and vice versa. Also, while reference may be made herein to quantitative measures, values, geometric relationships or the like, unless otherwise stated, any one or more if not all of these may be approximate to account for acceptable variations that may occur, such as those due to engineering tolerances or the like.

As used herein, unless specified otherwise or clear from context, the "or" of a set of operands is the "inclusive or" and thereby true if and only if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Furthermore, it should be understood that unless otherwise specified, the terms "data," "content," "digital content," "information," and similar terms may be at times used interchangeably.

Example implementations of the present disclosure are directed to diode bridges and, in particular, to an ideal diode bridge controller for Power over Ethernet (PoE). Features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

FIG. 1 illustrates an ideal diode bridge 100, according to some example implementations of the present disclosure. As shown, the ideal diode bridge 100 includes an ideal diode bridge controller 102 connected to a bridge rectifier 104. The bridge rectifier includes transistors Q1, Q2, Q3, Q4 arranged in two legs that are bridged by a pair of inputs IN1A, IN1B. As shown, in some examples, the transistors are field-effect transistors (FETs) such as metal-oxide-semiconductor FETs (MOSFETs). The transistors include high-side transistors Q2, Q3, and low-side transistors Q1, Q4. In some examples, the bridge rectifier includes a pair of outputs VOUTP, VOUTN to which the output voltage is provided; and in some of these examples, the high-side transistors Q2, Q3 are respectively connected between a positive one of the pair of outputs, i.e. VOUTP, and a respective one of the pair of inputs IN1A, IN1B and the low-side transistors Q1, Q4 are respectively connected between respective one of the pair of inputs IN1A, IN1B and a negative one of the pair of outputs, i.e. VOUTN.

The ideal diode bridge controller 102 includes gate drivers 106 connected to the pair of inputs IN1A, IN1B and the transistors Q1, Q2, Q3, Q4 to alternately switch the transistors on and off in pairs (Q2, Q4), (Q3, Q1) to cause the bridge rectifier to emulate a diode bridge for an input voltage at the pair of inputs. In some examples, the gate drivers may cause the bridge rectifier 102 to convert the input voltage of either of two polarities to an output voltage of one of the two polarities. The gate drivers 106 include high-side gate drivers 108 for the high-side transistors Q2, Q3, and low-side gate drivers 110 for the low-side transistors Q1, Q4.

As also shown in FIG. 1, respective ones of the low-side gate drivers 110 include linear drive circuitry 112 and digital drive circuitry 114. The linear drive circuitry 112 (at times referred to as a linear driver or a linear driver circuit) is electronic circuitry to provide a proportional and continuous output in response to a varying input signal. The digital drive circuitry (at times referred to as a digital driver or a digital driver circuit) is electronic circuitry to provide a discrete output (e.g., logic high or logic low) in response to an input signal.

According to some example implementations of the present disclosure, the linear drive circuitry 112 may drive a respective one of the low-side transistors Q1/Q4 to switch on and off based on forward current through the respective one of the low-side transistors. The digital drive circuitry 114 may detect a reverse current through the respective one of the low-side transistors Q1/Q4, and cause the respective one of the low-side transistors to switch off in response to the reverse current.

In the ideal diode bridge controller 102, the forward current is a current that flows from IN1A/IN1B (depending on polarity) to VOUTP; and as result, the forward current flows from source to drain of the pair of transistors (Q2, Q4) or (Q3, Q1) that is switched on (as shown, the source and drain are labeled as respectively "S" and "D"). The reverse current is a current that flows from VOUTP to IN1A/IN2B; and accordingly, the reverse current flows from the drain to the source of the pair of transistors that is switched on.

Figure 2:
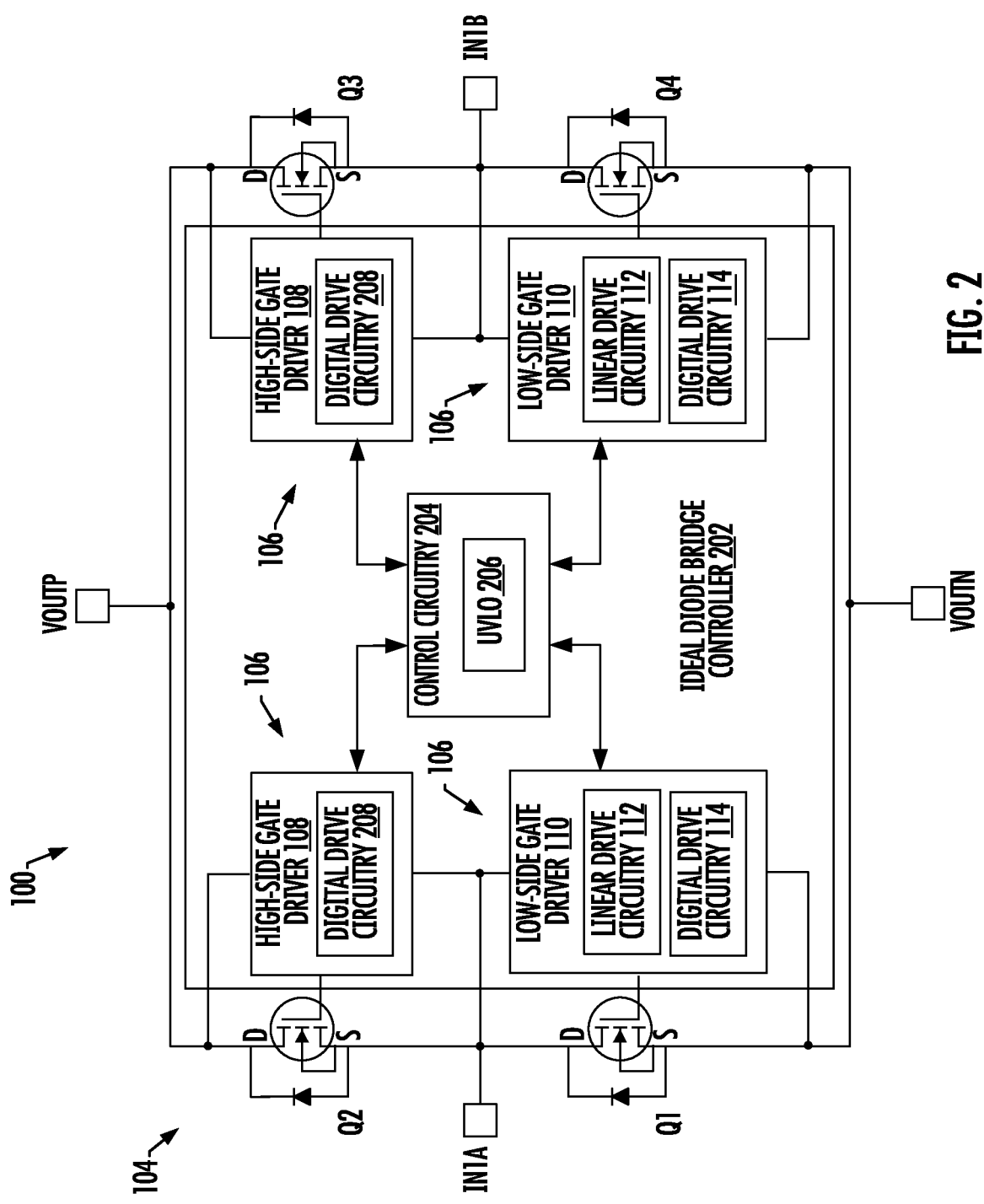
FIG. 2 illustrates an ideal diode bridge controller similar to an ideal diode bridge controller of FIG. 1, and including control circuitry, according to some example implementations.

FIG. 2 illustrates the ideal diode bridge 100 including an ideal diode bridge controller 202 similar to an ideal diode bridge controller 102, and including control circuitry 204, according to some example implementations. In some of these example implementations, the control circuitry 204 is to selectively enable and disable the gate drivers 106, which may include the linear drive circuitry 112 and the digital drive circuitry 114 of the respective ones of the low-side gate drivers 110. In some examples, the control circuitry 204 may alternately enable and disable the gate drivers 106 in pairs corresponding to the pairs (Q2, Q4), (Q3, Q1) in which the transistors are alternately switched on and off. In some examples, the control circuitry 204 may receive a signal from the digital drive circuitry 114 that indicates the reverse current is detected, and disable the gate drivers 106 in response to the signal. As also shown, the control circuitry 204 may include an under-voltage lockout (UVLO) circuit 206 to disable the gate drivers 106 when the input voltage is lower than a threshold voltage, and enable the gate drivers 106 when the input voltage is greater than the threshold voltage. Hysteresis may be supplied by UVLO circuit 206.

As indicated above, the ideal diode bridge 100 of some example implementations may be designed for Power over Ethernet (PoE). In some examples, then, the ideal diode bridge controller 202 may be connectable to or a component part of a powered device (PD) of a POE system, and the ideal diode bridge controller 202 and the PD may be connectable to an external power source such as a wall adapter (WA). In some of these examples, the control circuitry 204 may detect that the PD is connected to the external power source and disable the gate drivers 106 when the ideal diode bridge controller 202 and the PD are connected to the external power source.

As also shown in FIG. 2, and explained in greater detail below, in some examples, the respective ones of the high-side gate drivers 108 may include digital drive circuitry 208 to drive a respective one of the high-side transistors Q2/Q3 to switch on and off based on forward current through the respective one of the high-side transistors.

Figure 3:
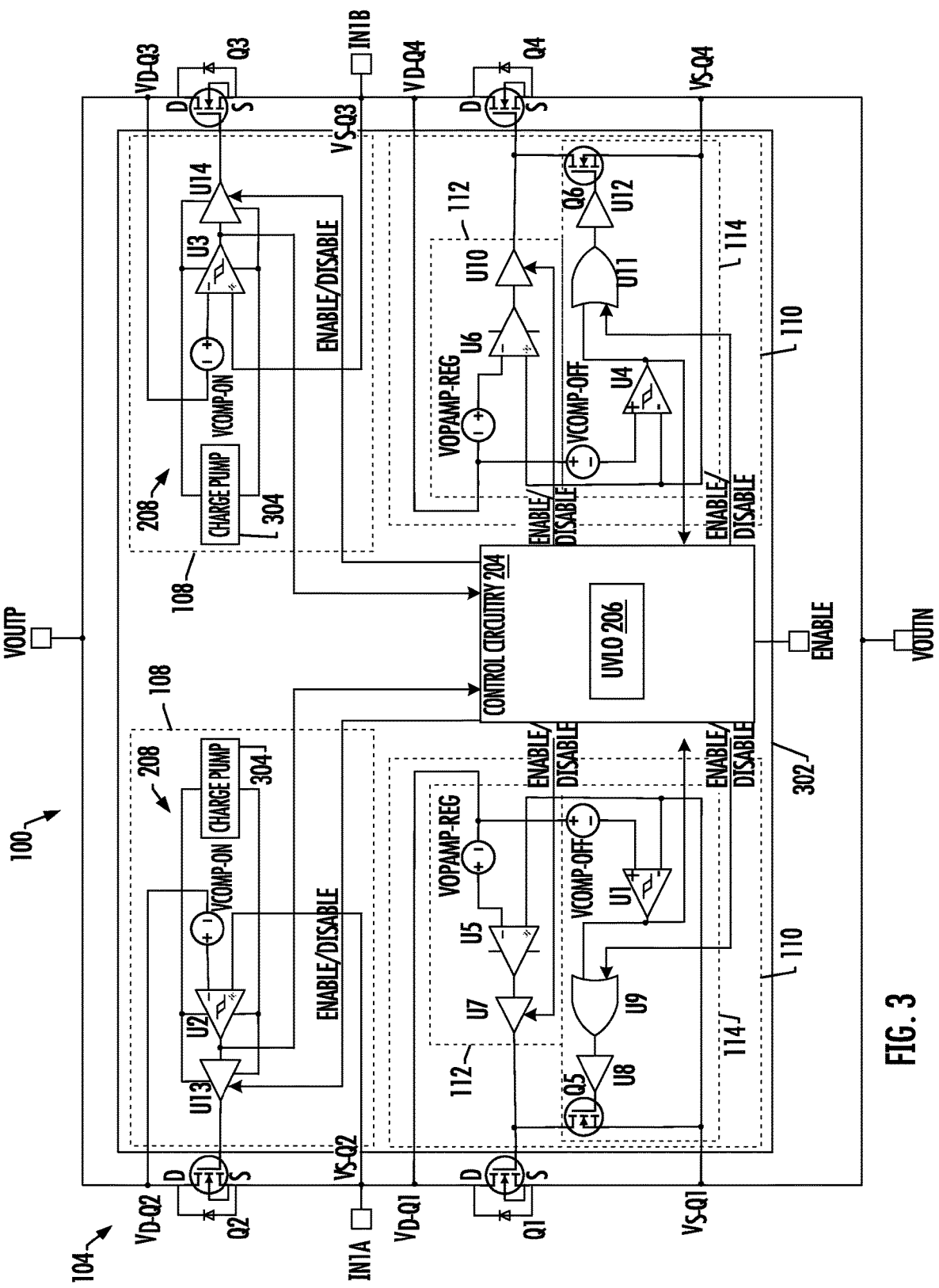
FIG. 3 illustrates an ideal diode bridge controller that may correspond to the ideal diode bridge controller of FIG. 2, according to some example implementations

FIG. 3 illustrates the ideal diode bridge 100 including an ideal diode bridge controller 302 that may correspond to the ideal diode bridge controller 202, according to some example implementations. As shown, the digital drive circuitry 208 of the respective ones of the high-side gate drivers 108 may include a comparator U2/U3 to compare a source voltage $V_S$ and a drain voltage $V_D$ of the respective one of the high-side transistors Q2/Q3 (shown as source voltage $V_{S-Q2/Q3}$ and drain voltage $V_{D-Q2/Q3}$), and output a switching signal to cause the respective one of the high-side transistors Q2/Q3 to switch on when the source voltage $V_S$ is larger than the drain voltage $V_D$, which is indicative that current is flowing through the MOSFET body diode of the respective one of the high-side transistors Q2/Q3. As also shown, in some examples, the comparator U2/U3 may drive the respective one of the low-side transistors Q2/Q3 through a respective buffer U13/U14. The respective buffer U13/U14 may be a tri-state buffer with an enable/disable input supplied by the control circuitry 204, which may be used to set the respective buffer U13/U14 to a high-impedance state to effectively disconnect the output of the respective buffer U13/U14 from the gate of the respective transistor Q2/Q3, and thereby disable the comparator U2/U3 and the digital drive circuitry 208.

In some examples, the digital drive circuitry 208 includes a voltage offset $V_{comp-on}$ (implemented as a voltage source) that sets a minimum voltage difference; and in some of these examples, the comparator U2/U3 outputs the switching signal when the source voltage $V_S$ is larger than the drain voltage $V_D$ by at least the voltage offset ($V_S>(V_D+V_{comp-on})$). The voltage offset and other voltage offsets described herein may be trimmable in that the voltage offset may be adjusted or fine-tuned to a specific value for improved performance of the ideal diode bridge controller 302. As also shown, in some examples, the digital drive circuitry 208 includes a charge pump 304 connected to the comparator U2/U3, and the buffer U13/U14 so that the switching signal output by comparator U2/U3, and buffered by buffer U13/U14 if provided, is boosted to the appropriate voltage to drive the respective one of the high-side transistors Q2/Q3. As also shown, in some examples, the output of the respective comparator U2/U3 is fed to a respective driver circuit U13/U14, which driver circuit U13/U14 drives the respective one of the high-side transistors Q2/Q3.

Now with attention to the low-side gate drivers 110. Again, the respective ones of the low-side gate drivers include linear drive circuitry 112 and digital drive circuitry 114. As shown in FIG. 3, in some examples, the linear drive circuitry 112 of the respective ones of the low-side gate drivers 110 includes an operational amplifier U5/U6 that includes a non-inverting input (+) and an inverting input (−) that are respectively connected to a source and a drain of the respective one of the low-side transistors Q1/Q4. As also shown, in some examples, the operational amplifier U5/U6 may drive the respective one of the low-side transistors Q1/Q4 through a respective buffer U7/U10. Similar to buffer U13/U14, the respective buffer U7/U10 may be a tri-state buffer with an enable/disable input supplied by the control circuitry 204, which may be used to set the respective buffer U7/U10 to a high-impedance state to effectively disconnect the output of the respective buffer U7/U10 from the gate of the respective transistor Q1/Q4, and thereby disable the operational amplifier U5/U6 and the linear drive circuitry 112.

In some examples, the operational amplifier U5/U6 may regulate a forward voltage of the respective one of the low-side transistors Q1/Q4 based on the forward current. In the ideal diode bridge controller 302, the forward voltage of the respective one of the low-side transistors Q1/Q4 is a positive voltage between the source and drain of the respective one of the low-side transistors Q1/Q4, i.e. the source is at a higher voltage than the drain. In some examples, the linear drive circuitry 112 may include a voltage offset $V_{opamp-reg}$ (implemented as a voltage source) that sets a minimum voltage to which the operational amplifier U5/U6 regulates the forward voltage in a linear mode of the respective ones of the respective low-side transistors Q1/Q4. The operational amplifier U5/U6 may provide a gate-to-source voltage to regulate the forward voltage for a forward current up to a corresponding current for the voltage offset and a characteristic on-resistance $R_{DS(on)}$ of the respective one of the low-side transistors Q1/Q4 in a saturation mode, i.e., the forward current=$V_{opamp-reg}/R_{DS(on)}$. Then, when the forward current increases to greater than $V_{opamp-reg}/R_{DS(on)}$, i.e., where the forward voltage is greater than $V_{opamp-reg}$, i.e., in the saturation mode of the respective one of the low-side transistors Q1/Q4, the forward voltage depends on the characteristic on-resistance $R_{DS(on)}$ and is not regulated by the operational amplifier U5/U6.

In some examples, the digital drive circuitry 114 of the respective ones of the low-side gate drivers 110 includes a comparator U1/U4 that includes a non-inverting input (+) and an inverting input (−) that are connected to a drain and a source of the respective one of the low-side transistors Q1/Q4.

In some examples, the comparator U1/U4 may compare a drain voltage $V_D$ and a source voltage $V_S$ of the respective one of the low-side transistors Q1/Q4 (shown as source voltage $V_{S-Q1/Q4}$ and drain voltage $V_{D-Q1/Q4}$). The comparator may output a signal to cause the respective one of the low-side transistors to switch off when the drain voltage $V_D$ is larger than the source voltage $V_S$, which indicates a reverse current is detected. As shown, in some examples, the comparator U1/U4 may drive the respective one of the low-side transistors Q1/Q4 through a respective buffer U8/U12.

In some further examples, the digital drive circuitry 114 includes a voltage offset $V_{comp-off}$ that sets a minimum voltage difference; and in some of these examples, the comparator U1/U4 may output the signal when the drain voltage $V_D$ is larger than the source voltage $V_S$ by at least the voltage offset $((V_D-V_{comp-off})>V_S)$. The reverse current at this point may be $V_{comp-off}/R_{DS(on)}$, where $R_{DS(on)}$ is the characteristic on-resistance $R_{DS(on)}$ of the respective one of the low-side transistors Q1/Q4.

As also shown, in some examples, the digital drive circuitry 114 includes a switching transistor Q5/Q6 connected to the respective one of the low-side transistors Q1/Q4, such as in the manner of a low-side switch. In this regard, a low-side switch is a switch positioned on the "low side" of the load of the ideal diode bridge controller 302 (i.e., the side of the load closer to VOUTN). In some of these examples, the signal output by comparator U1/U4 is a switching signal to drive the switching transistor to switch on Q5/Q6, which switching transistor Q5/Q6 pulls a gate voltage of the respective one of the low-side transistors Q1/Q4 down to cause the respective one of the low-side transistors to switch off.

In some further examples, the signal output by the comparator U1/U4 is a first signal, and the control circuitry 204 outputs a second signal to selectively enable the digital drive circuitry 114. In these examples, the digital drive circuitry 114 includes a logic OR gate U9/U11 to cause the respective one of the low-side transistors Q1/Q4 to switch off in response to either the first signal from the comparator or the second signal from the control circuitry 204. In this regard, the logic OR gate may output a switching signal to drive the switching transistor Q5/Q6 to switch on and pull the gate voltage of the respective one of the low-side transistors Q1/Q4 down to cause the respective one of the low-side transistors to switch off.

As also shown, in the context of the ideal diode bridge controller 302 connected to a PD of a POE system, the control circuitry 204 may include an input WA_Enable that may indicate the ideal diode bridge controller 302 and the PD are connected to an external power source. In these situations, the control circuitry 204 may disable the gate drivers 106. Disabling the gate drivers 106 in these and other situations may involve the control circuitry sending an appropriate signal to tri-state buffers U7, U10 of the linear drive circuitry 112 of the low-side gate drivers 110 to disable the linear drive circuitry by setting the tri-state buffers U7, U10 of the linear drive circuitry 112 to a high impedance state. The control circuitry may likewise send an appropriate signal to tri-state buffers U13, U14 of the high-side gate drivers 208 to disable the high-side gate drivers by setting the tri-state buffers U13, U14 of the high-side gate drivers 208 to a high impedance state. Even further, as described above, the control circuitry may send an appropriate (second) signal to the OR logic gates U9, U11 of the digital drive circuitry 114 of the low-side gate drivers 110 to drive the switching transistor Q5/Q6 to switch on and pull the gate voltage of the respective one of the low-side transistors Q1/Q4 down to cause the respective one of the low-side transistors to switch off.

Figure 4:
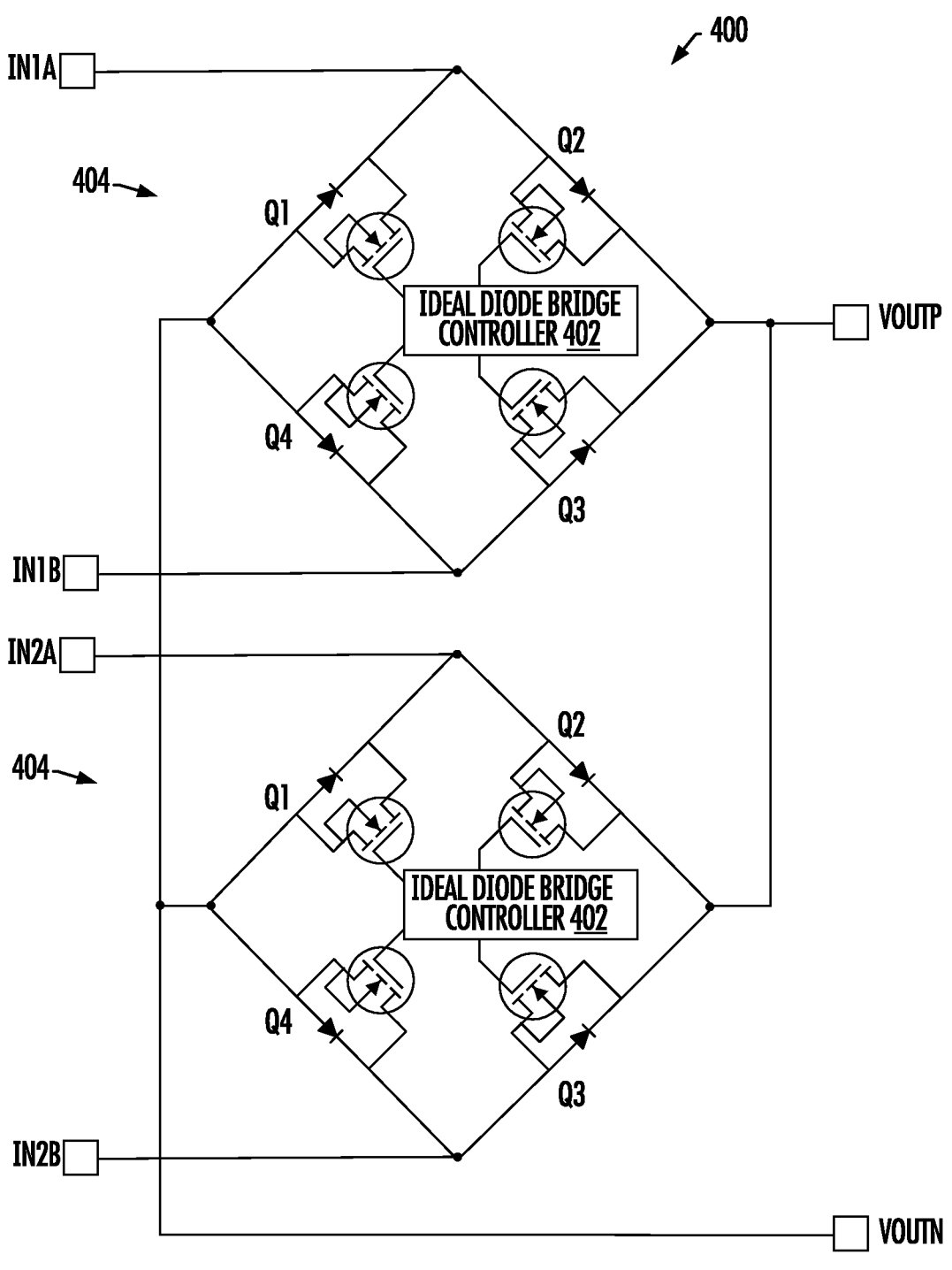
FIG. 4 illustrates an ideal diode bridge controller including two bridge rectifiers, according to some example implementations.

In some examples, the ideal diode bridge controller 102, 202, 302 may be implemented in a dual bridge rectifier. FIG. 4 illustrates an ideal diode bridge 400 including at least one ideal diode bridge controller 402 and two bridge rectifiers 404, according to some example implementations. In this regard, the ideal diode bridge 400 may include two ideal diode bridge controllers 402 for the two bridge rectifiers 404. As shown, one of the two bridge rectifiers 404 may be coupled to inputs IN1A, IN2A, and the other of the two bridge rectifiers 404 may be coupled to inputs IN1B, IN2B.

The input voltage, then, may be provided at the pair of inputs of either one of the two bridge rectifiers 404 that converts the input voltage to an output voltage, which may be provided to a pair of outputs VOUTP, VOUTN connected to both of the two bridge rectifiers, and the output voltage is provided to the pair of outputs. As also shown, the high-side transistors Q2, Q3 of the respective two bridge rectifiers 404 are connected to a positive one of the pair of outputs VOUTP, and the low-side transistors Q1, Q4 of the respective two bridge rectifiers 404 are connected to a negative one of the pair of outputs VOUTN. Although not separately shown in FIG. 4, the diode bridge controller 402 may include control circuitry 204 for respective ones of the two bridge rectifiers 404, or the diode bridge controller 402 may include a single control circuitry for both of the two bridge rectifiers 404.

Figure 5:
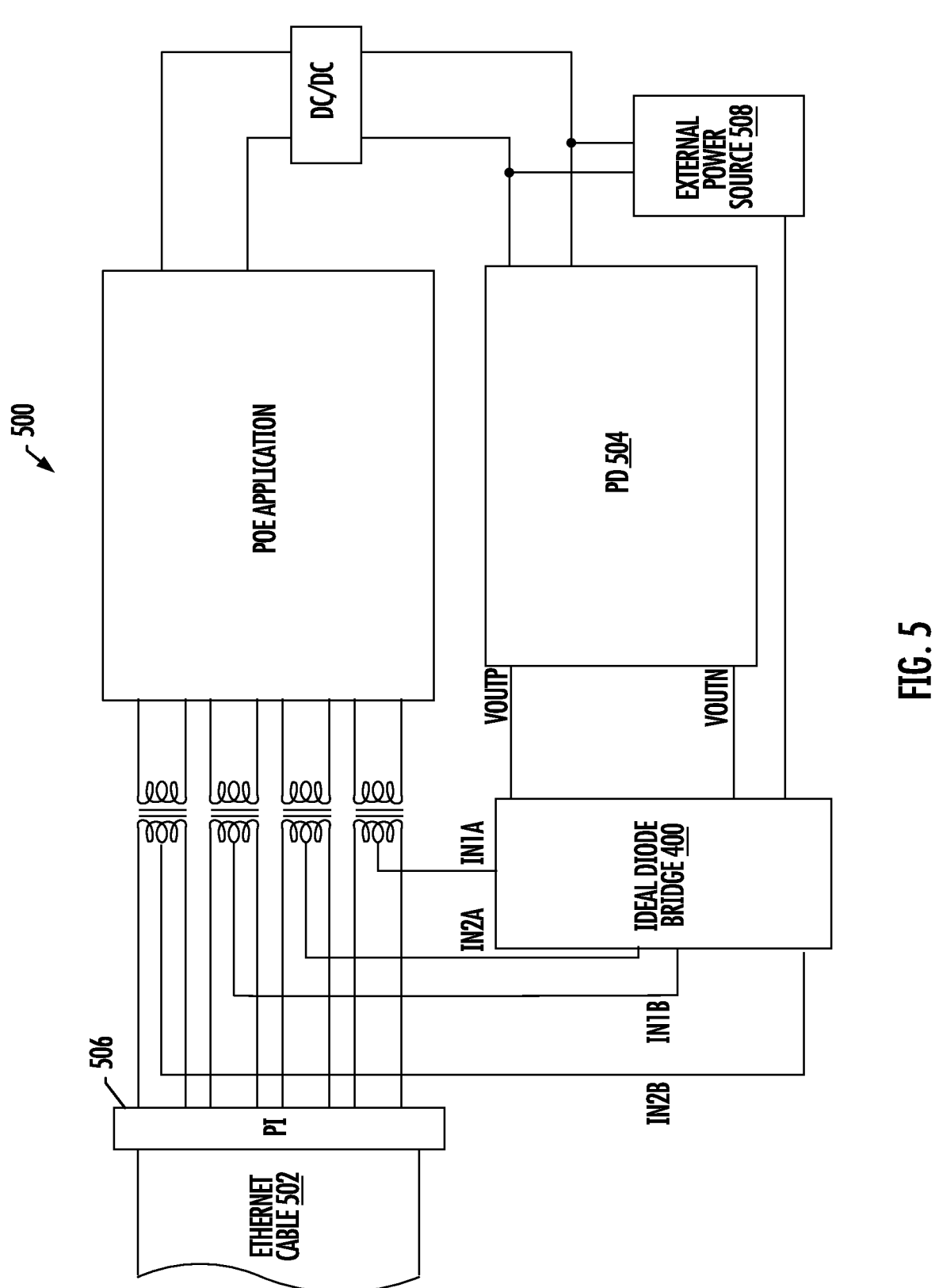
FIG. 5 is a block diagram of a Power over Ethernet (PoE) system including the ideal diode bridge controller of FIG. 4, according to some example implementations.

FIG. 5 is a block diagram of a Power over Ethernet (PoE) system 500 including the ideal diode bridge 400, according to some example implementations. Again, the PoE system may include an Ethernet cable 502 to deliver electrical power alongside data signals. Power may be injected into the Ethernet cable 502 at a power sourcing equipment (PSE). The power may then be extracted at a powered device (PD) 504, which is the device receiving the power and data over the Ethernet cable 502. In this regard, the PD 504 may accept power delivered over the Ethernet cable 502 over which data is carried, and the ideal diode bridge 400 may provide polarity correction for the power delivered over the Ethernet cable. As shown, the PD 504 may accept power from a power interface (PI) 506 of the Ethernet cable, such as an Ethernet (e.g., RJ-45) connector, the PD 504 receiving the power from ideal diode bridge converter 400.

In the PoE system 500, the PD 504 and the PSE may perform a handshake procedure when the PD is connected to the PSE over the Ethernet cable 502. When the PD 504 is connected to the PSE over the Ethernet cable 502, the PSE performs a detection operation to determine if the PD 504 is PoE-compatible, and a classification operation to determine power requirements of the PD 504. In the PoE system 500 of example implementations of the present disclosure, the ideal diode bridge controller 402 of the ideal diode bridge 400 may include an enable input to enable or disable the ideal diode bridge controller and thereby the ideal diode bridge. In some examples, then, the PD 504 may supply the enable input with a logic high voltage to disable the ideal diode bridge controller 402 during detection and classification operations to decrease the influence of the ideal diode bridge 400 consumption current on detection and classification current.

The linear drive circuitry 112 and the digital drive circuitry 114 of the respective ones of the low-side gate drivers 110 may cooperate to enable the low-side gate drivers 110, responsive to the linear drive circuitry 112 to turn on the transistors Q1/Q4 in a controlled and smooth manner, and responsive to the digital drive circuitry 114 quickly (e.g., in less than 100 nanoseconds) turn off the transistors Q1/Q4. In this context, quickly and similar terms refer to the times shorter than the rise time of a surge waveform as specified by the International Telecommunication Union (ITU) Recommendation ITU-T K.21, *Resistibility of Telecommunication Equipment Installed in Customer Premises to Overvoltages and Overcurrents* (2022). In one example, the transistors Q1/Q4 may be quickly turned off when the ideal diode bridge 400 and the PD 504 are connected to an external power source 508 with the external power source 508 providing a voltage greater than the input voltage. In another example, the transistors Q1/Q4 may be quickly turned off responsive to the digital drive circuitry 114 in the case of a negative current lightning surge to prevent a short circuit between the PSE and a lightning surge voltage.

The linear drive circuitry 112 placed at the low-side gate drivers 110 may also provide benefit over the high-side gate drivers 108. In this regard, the linear drive circuitry may avoid the need for charge pumps 304 of the high-side gate drivers 108 that are relatively large, with the operational amplifiers U5, U6 providing a sufficient current on the low-side. When the ideal diode bridge controller 102 is implemented in an integrated circuit (IC), placing the linear drive circuitry 110 at the low-side gate drivers may therefore reduce the footprint of the ideal diode bridge controller 102, 202 or 302 and reduce the cost of the IC.

Figure 6:
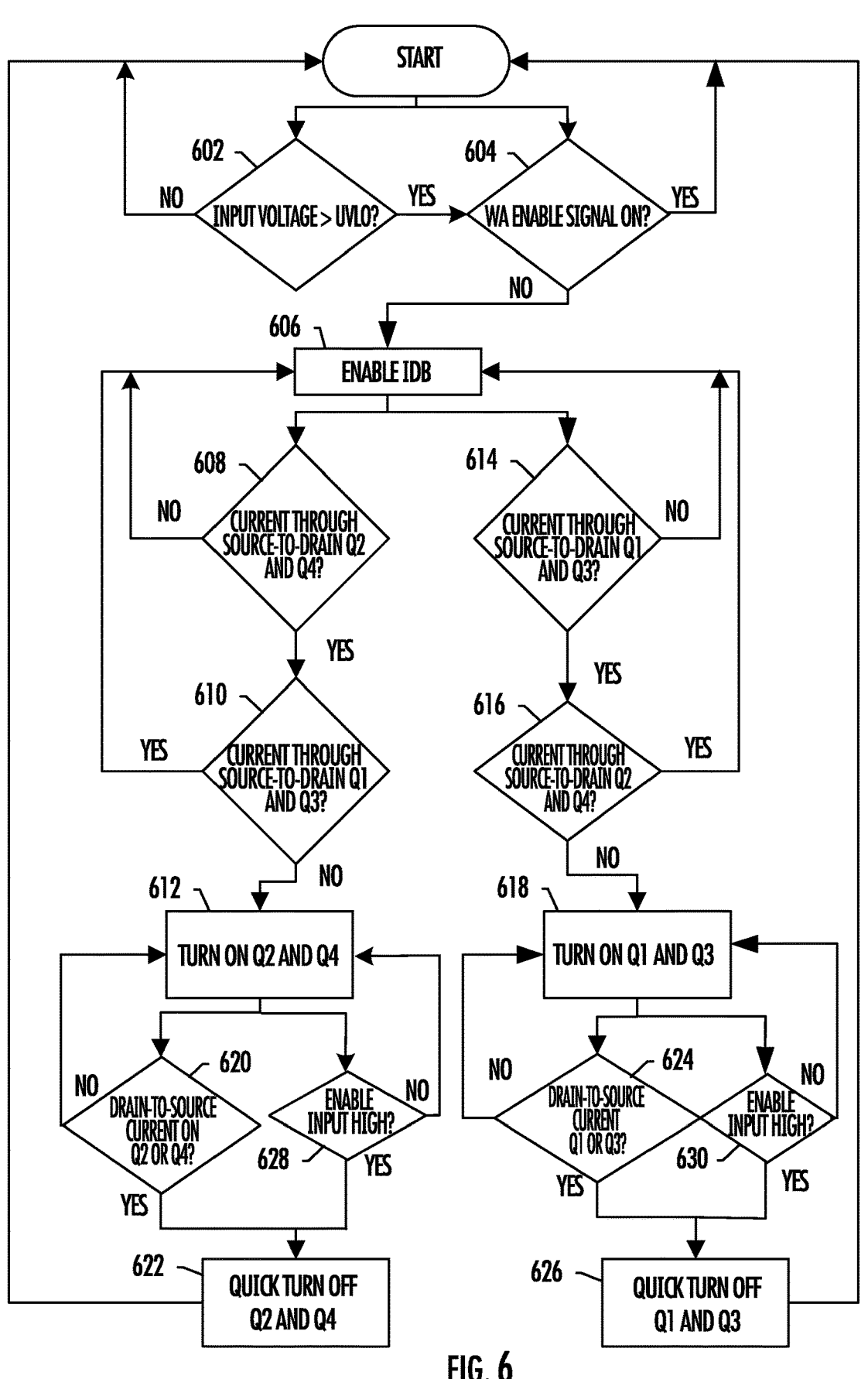
FIG. 6 illustrates various operations in a method of operating an ideal diode bridge controller, according to some example implementations.

To further illustrate example implementations of the present disclosure, FIG. 6 illustrates various operations in a method of operating an ideal diode bridge controller 102, 202 or 302, according to some example implementations. As shown at blocks 602, 604 and 606, the control circuitry 204 may enable the ideal diode bridge controller when an input voltage is greater than an under voltage lockout (UVLO) voltage, and the ideal diode bridge controller is not connected to an external power source (e.g., as indicated by a logic low voltage at an enable input of the ideal diode bridge controller).

When a forward, source-to-drain current flows through one pair of transistors (Q2, Q4), but not the other pair of transistors (Q3, Q1), the gate drivers 106 switch the one pair of transistors (Q2, Q4) on, as shown at blocks 608, 610 and 612. As shown in FIG. 3, for example, the control circuitry 204 may receive inputs from the outputs of comparators U1, U2, U3 and U4 that indicate the flow of current through the transistors Q1, Q2, Q3 and Q4. To switch on the one pair of transistors (Q2, Q4) the control circuitry may send appropriate signals to buffers (U13, U10) to enable respective ones of the high-side gate drivers 108 and low-side gate drivers 110. Alternately, when a forward, source-to-drain current flows through the other pair of transistors (Q3, Q1), but not the one pair of transistors (Q2, Q4), the gate drivers switch the other pair of transistors (Q3, Q1) on, as shown at blocks 614, 616 and 618. Again, as shown in FIG. 3, for example, the control circuitry 204 may send appropriate signals to buffers (U14, U7) to enable respective ones of the high-side gate drivers 108 and low-side gate drivers 110 to switch the other pair of transistors (Q3, Q1) on.

When the one pair of transistors (Q2, Q4) is on, and a reverse, drain-to-source current through the one pair of transistors (Q2, Q4) is detected, the control circuitry 204 disables the gate drivers 106, and in particular the digital drive circuitry 114, 208, to quickly turn off the one pair of transistors (Q2, Q4), as shown at blocks 620 and 622. In particular, for example, the control circuitry may send appropriate signals to buffer U13 and logic OR gate U11 to disable respective ones of the digital drive circuitry 114, 208 for the one pair of transistors (Q2, Q4). Likewise, when the other pair of transistors (Q3, Q1) is on, and a reverse, drain-to-source current through the other pair of transistors (Q3, Q1) is detected, the control circuitry disables the gate drivers 106 to quickly turn off the other pair of transistors (Q3, Q1), as shown at blocks 624 and 626. The control circuitry may also quickly turn off the one or the other of the pairs of transistors (Q2, Q4), (Q3, Q1), when the control circuitry detects the ideal diode bridge controller is connected to an external power source (as indicated by a logic high voltage at the enable input of the ideal diode bridge controller), as shown at blocks 628 and 630.

Figure 7:
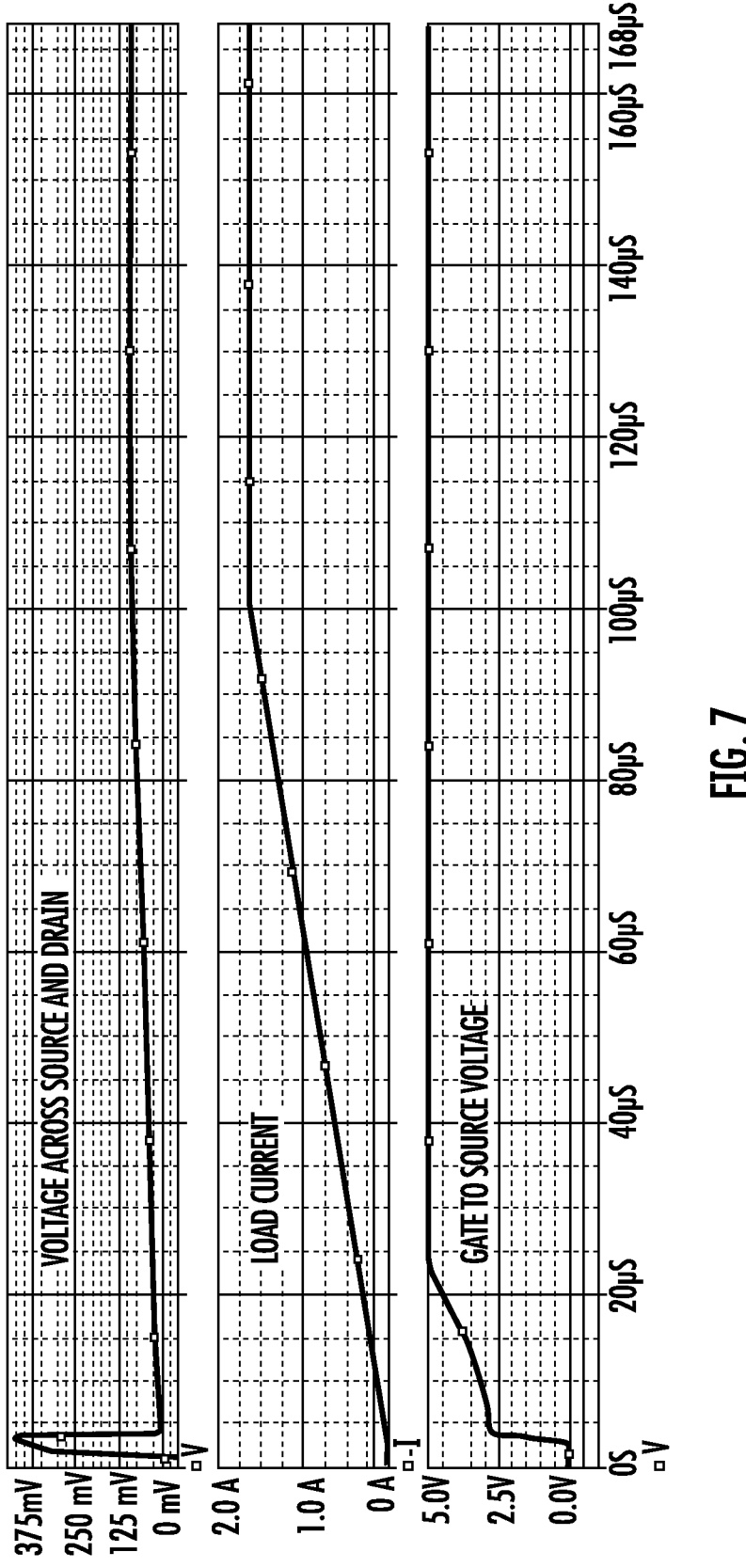
FIG. 7 illustrates graphs of various currents and voltages during a simulation of the ideal diode bridge controller of FIG. 3, according to some example implementations.

FIG. 7 illustrates graphs of various currents and voltages over time during a simulation of the ideal diode bridge controller 302, according to some example implementations. In the illustrated example, the low-side transistors Q1, Q4 have a 2.5V threshold voltage and a 5V saturation voltage, although in other examples, the low-side transistors Q1, Q4 may have other characteristic voltages. As shown, current initially flows through the body diode of a respective one of the low-side transistors Q1/Q4, as indicated by a gate-to-source voltage of zero. This may also be indicated by an increase in the source to drain voltage of the respective one of the low-side transistors Q1/Q4 to approximately 375 mV, which is a forward voltage drop on the body diode when current flows through the body diode.

When the voltage across the body diode becomes larger than $V_{opamp\text{-}reg}$ (plus an operational amplifier internal offset), the operational amplifier U5/U6 starts to regulate the forward voltage of Q1/Q4 source-to-drain to $V_{opamp\text{-}reg}$ up to a load current of $V_{opamp\text{-}reg}/R_{DS(on)}$, which $R_{DS(on)}$ is the on-resistance of Q1/Q4. This may be seen in the figure in which the gate-to-source voltage is higher than the 2.5V threshold voltage of the respective one of the low-side transistors Q1/Q4, but less than the 5V saturation voltage, indicating the respective one of the low-side transistors Q1/Q4 is not fully on.

For a load current greater than $V_{opamp\text{-}reg}/R_{DS(on)}$, the forward voltage depends on $R_{RD(on)}$. That is, when the forward voltage of the respective one of the low-side transistors Q1/Q4 is greater than $V_{opamp\text{-}reg}$, the operational amplifier U5/U6 may regulate the forward voltage. Although not shown in FIG. 7, if $V_{opamp\text{-}reg}$=20 mV and $R_{RD(on)}$=50 mOhm, for example, the operational amplifier U5/U6 may regulate the forward voltage of Q1/Q4 up to current=20 mV/50 mOhm=400 mA. For a load current greater than 400 mA, Q1/Q4 may be fully enhanced and the forward voltage increases based on the load current, until the saturation voltage of Q1/Q4 is reached, which in this example is 5V.

In the ideal diode bridge controller 302, the forward current flows from the source to the drain of one of the pairs of transistors (Q2, Q4) or (Q3, Q1). When an external power source is connected to the ideal diode bridge controller 302 and the PD, and the voltage of the external power source is greater than the input voltage of the ideal diode bridge controller 302, current from the external power source may flow from the drain to the source, and damage the PSE. The comparator U1/U4 of the digital drive circuitry 114 may therefore monitor reverse current from the drain-to-source voltage, and very quickly cause the respective one of the low-side transistors Q1/Q4 to switch off in response to the reverse current, such as when the reverse current reaches a value of $V_{comp\text{-}off}/R_{DS(on)}$. The gate drivers 106 for the transistors may likewise be disabled by the control circuitry 204.

FIGS. 8A-8J are flowcharts illustrating various steps in a method 800, according to various example implementations. The method includes alternately switching transistors of a bridge rectifier on and off in pairs to cause the bridge rectifier to convert an input voltage of either of two polarities to an output voltage of one of the two polarities, as shown at block 802 of FIG. 8A. The transistors are arranged as high-side transistors that are switched on and off by high-side gate drivers, and low-side transistors that are switched on and off by low-side gate drivers, respective ones of the low-side gate drivers including linear drive circuitry and digital drive circuitry. The method includes driving a respective one of the low-side transistors to switch on and off, by the linear drive circuitry, based on forward current through the respective one of the low-side transistors, as shown at block 804. The method includes detecting a reverse current through the respective one of the low-side transistors at the digital drive circuitry, as shown at block 806. And the method includes causing the respective one of the low-side transistors to switch off, by the digital drive circuitry, in response to the reverse current, as shown at block 808.

In some examples, the method 800 includes selectively enabling and disabling the high-side gate drivers and the low-side gate drivers, including selectively enabling and disabling the linear drive circuitry and the digital drive circuitry of the respective ones of the low-side gate drivers, as shown at block 810 of FIG. 8B.

In some examples, the method 800 includes alternately enabling and disabling the high-side gate drivers and the low-side gate drivers in pairs corresponding to the pairs in which the transistors are alternately switched on and off, as shown at block 812 of FIG. 8C.

In some examples, the method 800 includes receiving a signal from the digital drive circuitry that indicates the reverse current is detected, as shown at block 814 of FIG. 8D. In some of these examples, the method includes disabling the high-side gate drivers and the low-side gate drivers in response to the signal from the digital drive circuitry that indicates the reverse current is detected, as shown at block 816.

In some examples, the method 800 includes disabling the high-side gate drivers and the low-side gate drivers when the input voltage is less than a threshold voltage, as shown at block 818 of FIG. 8E.

In some examples, the method 800 includes regulating a forward voltage of the respective one of the low-side transistors, by the linear drive circuitry, the forward voltage regulated for the forward current up to a corresponding current for a voltage offset and a characteristic on-resistance of the respective one of the low-side transistors in a saturation mode, as shown at block 820 of FIG. 8F.

In some examples, the method 800 includes comparing a drain voltage and a source voltage of the respective one of the low-side transistors at the digital drive circuitry, as shown at block 822 of FIG. 8G. In some of these examples, the method includes outputting a signal from the digital drive circuitry to cause the respective one of the low-side transistors to switch off when the drain voltage is larger than the source voltage, which indicates the reverse current is detected, as shown at block 824.

In some examples, the method 800 includes comparing a drain voltage and a source voltage of the respective one of the low-side transistors at the digital drive circuitry, as shown at block 826 of FIG. 8H. In some of these examples, the method includes outputting a signal from the digital drive circuitry to cause the respective one of the low-side transistors to switch off when the drain voltage is larger than the source voltage by at least a voltage offset, as shown at block 828.

In some examples, respective ones of the high-side gate drivers include digital drive circuitry, and the method 800 includes driving a respective one of the high-side transistors to switch on and off, by the digital drive circuitry, based on forward current through the respective one of the high-side transistors, as shown at block 830 of FIG. 8I.

In some examples, the method 800 includes comparing a source voltage and a drain voltage of the respective one of the high-side transistors at the digital drive circuitry, as shown at block 832 of FIG. 8J. In some of these examples, the method includes outputting a switching signal from the digital drive circuitry to cause the respective one of the high-side transistors to switch on when the source voltage is larger than the drain voltage, the switching signal output when the source voltage is larger than the drain voltage by at least a voltage offset, as shown at block 834.

As explained above and reiterated below, the present disclosure includes, without limitation, the following example implementations.

Clause 1. An ideal diode bridge controller comprising: gate drivers to connect to transistors of a bridge rectifier in which the transistors are arranged as high-side transistors and low-side transistors, the gate drivers to alternately switch the transistors on and off in pairs to cause the bridge rectifier to convert an input voltage of either of two polarities to an output voltage of one of the two polarities, the gate drivers including high-side gate drivers for the high-side transistors, and low-side gate drivers for the low-side transistors, respective ones of the low-side gate drivers including: linear drive circuitry to drive a respective one of the low-side transistors to switch on and off based on forward current through the respective one of the low-side transistors; and digital drive circuitry to detect a reverse current through the respective one of the low-side transistors, and cause the respective one of the low-side transistors to switch off in response to the reverse current.

Clause 2. The ideal diode bridge controller of clause 1, comprising control circuitry to selectively enable and disable the gate drivers, including the control circuitry to selectively enable and disable the linear drive circuitry and the digital drive circuitry of the respective ones of the low-side gate drivers.

Clause 3. The ideal diode bridge controller of clause 1 or clause 2, comprising control circuitry to alternately enable and disable the gate drivers in pairs corresponding to the pairs in which the transistors are alternately switched on and off.

Clause 4. The ideal diode bridge controller of any of clauses 1 to 3, comprising control circuitry to receive a signal from the digital drive circuitry that indicates the reverse current is detected, and disable the gate drivers in response to the signal.

Clause 5. The ideal diode bridge controller of any of clauses 1 to 4, comprising control circuitry that includes an under-voltage lockout (UVLO) circuit to disable the gate drivers when the input voltage is less than a threshold voltage.

Clause 6. The ideal diode bridge controller of any of clauses 1 to 5, wherein the linear drive circuitry includes an operational amplifier to regulate a forward voltage of the respective one of the low-side transistors based on the forward current, and wherein the linear drive circuitry includes a voltage offset that sets a minimum voltage to which the operational amplifier regulates the forward voltage in a linear mode of the respective ones of the transistors, and the operational amplifier regulates the forward voltage for the forward current up to a corresponding current for the voltage offset and a characteristic on-resistance of the respective one of the low-side transistors in a saturation mode.

Clause 7. The ideal diode bridge controller of any of clauses 1 to 6, wherein the digital drive circuitry includes a comparator to compare a drain voltage and a source voltage of the respective one of the low-side transistors, and output a signal to cause the respective one of the low-side transistors to switch off when the drain voltage is larger than the source voltage, which indicates the reverse current is detected.

Clause 8. The ideal diode bridge controller of any of clauses 1 to 7, wherein the digital drive circuitry includes: a voltage offset that sets a minimum voltage difference; and a comparator to compare a drain voltage and a source voltage of the respective one of the low-side transistors, and output a signal to cause the respective one of the low-side transistors to switch off when the drain voltage is larger than the source voltage by at least the voltage offset.

Clause 9. The ideal diode bridge controller of any of clauses 1 to 8, wherein respective ones of the high-side gate drivers include digital drive circuitry to drive a respective one of the high-side transistors to switch on and off based on forward current through the respective one of the high-side transistors.

Clause 10. The ideal diode bridge controller of clause 9, wherein the digital drive circuitry includes a comparator to compare a source voltage and a drain voltage of the respective one of the high-side transistors, and output a switching signal to cause the respective one of the high-side transistors to switch on when the source voltage is larger than the drain voltage, and wherein the digital drive circuitry includes a voltage offset that sets a minimum voltage difference, and the comparator outputs the switching signal when the source voltage is larger than the drain voltage by at least the voltage offset.

Clause 11. A method comprising: alternately switching transistors of a bridge rectifier on and off in pairs to cause the bridge rectifier to convert an input voltage of either of two polarities to an output voltage of one of the two polarities, the transistors arranged as high-side transistors that are switched on and off by high-side gate drivers, and low-side transistors that are switched on and off by low-side gate drivers, respective ones of the low-side gate drivers including linear drive circuitry and digital drive circuitry; driving a respective one of the low-side transistors to switch on and off, by the linear drive circuitry, based on forward current through the respective one of the low-side transistors; and at the digital drive circuitry, detecting a reverse current through the respective one of the low-side transistors; and causing the respective one of the low-side transistors to switch off in response to the reverse current.

Clause 12. The method of clause 11, comprising selectively enabling and disabling the high-side gate drivers and the low-side gate drivers, including selectively enabling and disabling the linear drive circuitry and the digital drive circuitry of the respective ones of the low-side gate drivers.

Clause 13. The method of clause 11 or clause 12, comprising alternately enabling and disabling the high-side gate drivers and the low-side gate drivers in pairs corresponding to the pairs in which the transistors are alternately switched on and off.

Clause 14. The method of any of clauses 11 to 13, comprising: receiving a signal from the digital drive circuitry that indicates the reverse current is detected; and disabling the high-side gate drivers and the low-side gate drivers in response to the signal from the digital drive circuitry that indicates the reverse current is detected.

Clause 15. The method of any of clauses 11 to 14, comprising disabling the high-side gate drivers and the low-side gate drivers when the input voltage is less than a threshold voltage.

Clause 16. The method of any of clauses 11 to 15, comprising regulating a forward voltage of the respective one of the low-side transistors, by the linear drive circuitry, the forward voltage regulated for the forward current up to a corresponding current for a voltage offset and a characteristic on-resistance of the respective one of the low-side transistors in a saturation mode.

Clause 17. The method of any of clauses 11 to 16, comprising: comparing a drain voltage and a source voltage of the respective one of the low-side transistors at the digital drive circuitry; and outputting a signal from the digital drive circuitry to cause the respective one of the low-side transistors to switch off when the drain voltage is larger than the source voltage, which indicates the reverse current is detected.

Clause 18. The method of any of clauses 11 to 17, comprising: comparing a drain voltage and a source voltage of the respective one of the low-side transistors at the digital drive circuitry; and outputting a signal from the digital drive circuitry to cause the respective one of the low-side transistors to switch off when the drain voltage is larger than the source voltage by at least a voltage offset.

Clause 19. The method of any of clauses 11 to 18, wherein respective ones of the high-side gate drivers include digital drive circuitry, and the method comprises driving a respective one of the high-side transistors to switch on and off, by the digital drive circuitry, based on forward current through the respective one of the high-side transistors.

Clause 20. The method of clause 19, comprising: comparing a source voltage and a drain voltage of the respective one of the high-side transistors at the digital drive circuitry; and outputting a switching signal from the digital drive circuitry to cause the respective one of the high-side transistors to switch on when the source voltage is larger than the drain voltage, the switching signal output when the source voltage is larger than the drain voltage by at least a voltage offset.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An ideal diode bridge controller comprising:
gate drivers to connect to transistors of a bridge rectifier in which the transistors are arranged as high-side transistors and low-side transistors, the gate drivers to alternately switch the high-side transistors and the low-side transistors on and off in pairs comprising one of the high-side transistors and an opposite one of the low-side transistors to cause the bridge rectifier to convert an input voltage of either of two polarities to an output voltage of one of the two polarities, the gate drivers including high-side gate drivers for the high-side transistors, and low-side gate drivers for the low-side transistors, respective ones of the low-side gate drivers including:
linear drive circuitry comprising an operational amplifier to regulate a forward voltage of a respective one of the low-side transistors to drive the respective one of the low-side transistors to switch on and off based on forward current through the respective one of the low-side transistors; and digital drive circuitry to detect a reverse current through the respective one of the low-side transistors, and cause the respective one of the low-side transistors to switch off in response to the reverse current, wherein the linear drive circuitry includes a first voltage offset that sets a minimum voltage to which the operational amplifier regulates the forward voltage in a linear mode of the respective ones of the transistors, and the operational amplifier regulates the forward voltage for the forward current up to a corresponding current for the first voltage offset and a characteristic on-resistance of the respective one of the low-side transistors in a saturation mode.

2. The ideal diode bridge controller of claim 1, comprising control circuitry to selectively enable and disable the gate drivers, including the control circuitry to selectively enable and disable the linear drive circuitry and the digital drive circuitry of the respective ones of the low-side gate drivers.

3. The ideal diode bridge controller of claim 1, comprising control circuitry to alternately enable and disable the gate drivers in pairs corresponding to the pairs in which the transistors are alternately switched on and off.

4. The ideal diode bridge controller of claim 1, comprising control circuitry to receive a signal from the digital drive circuitry that indicates the reverse current is detected, and disable the gate drivers in response to the signal.

5. The ideal diode bridge controller of claim 1, comprising control circuitry that includes an under-voltage lockout (UVLO) circuit to disable the gate drivers when the input voltage is less than a threshold voltage.

6. The ideal diode bridge controller of claim 1, wherein the digital drive circuitry includes a comparator to compare a drain voltage and a source voltage of the respective one of the low-side transistors, and output a signal to cause the respective one of the low-side transistors to switch off when the drain voltage is larger than the source voltage, which indicates the reverse current is detected.

7. The ideal diode bridge controller of claim 1, wherein the digital drive circuitry includes:

a second voltage offset that sets a minimum voltage difference; and a comparator to compare a drain voltage and a source voltage of the respective one of the low-side transistors, and output a signal to cause the respective one of the low-side transistors to switch off when the drain voltage is larger than the source voltage by at least the second voltage offset.

8. The ideal diode bridge controller of claim 1, wherein respective ones of the high-side gate drivers include digital drive circuitry to drive a respective one of the high-side transistors to switch on and off based on forward current through the respective one of the high-side transistors.

9. The ideal diode bridge controller of claim 8, wherein the digital drive circuitry includes a comparator to compare a source voltage and a drain voltage of the respective one of the high-side transistors, and output a switching signal to cause the respective one of the high-side transistors to switch on when the source voltage is larger than the drain voltage, and wherein the digital drive circuitry includes a second voltage offset that sets a minimum voltage difference, and the comparator outputs the switching signal when the source voltage is larger than the drain voltage by at least the second voltage offset.

10. A method comprising:

alternately switching high-side transistors and low-side transistors of a bridge rectifier on and off in pairs comprising one of the high-side transistors and an opposite one of the low-side transistors to cause the bridge rectifier to convert an input voltage of either of two polarities to an output voltage of one of the two polarities, the transistors arranged as the high-side transistors that are switched on and off by high-side gate drivers, and the low-side transistors that are switched on and off by low-side gate drivers, respective ones of the low-side gate drivers including linear drive circuitry and digital drive circuitry;

regulating, by an operational amplifier, a forward voltage of a respective one of the low-side transistors to drive the respective one of the low-side transistors to switch on and off, by the linear drive circuitry, based on forward current through the respective one of the low-side transistors; and at the digital drive circuitry:

detecting a reverse current through the respective one of the low-side transistors; and causing the respective one of the low-side transistors to switch off in response to the reverse current, wherein the forward voltage is regulated for the forward current up to a corresponding current for a first voltage offset and a characteristic on-resistance of the respective one of the low-side transistors in a saturation mode.

11. The method of claim 10, comprising selectively enabling and disabling the high-side gate drivers and the low-side gate drivers, including selectively enabling and disabling the linear drive circuitry and the digital drive circuitry of the respective ones of the low-side gate drivers.

12. The method of claim 10, comprising alternately enabling and disabling the high-side gate drivers and the low-side gate drivers in pairs corresponding to the pairs in which the transistors are alternately switched on and off.

13. The method of claim 10, comprising:

receiving a signal from the digital drive circuitry that indicates the reverse current is detected; and disabling the high-side gate drivers and the low-side gate drivers in response to the signal from the digital drive circuitry that indicates the reverse current is detected.

14. The method of claim 10, comprising disabling high-side gate drivers and the low-side gate drivers when the input voltage is less than a threshold voltage.

15. The method of claim 10, comprising:

comparing a drain voltage and a source voltage of the respective one of the low-side transistors at the digital drive circuitry; and outputting a signal from the digital drive circuitry to cause the respective one of the low-side transistors to switch off when the drain voltage is larger than the source voltage, which indicates the reverse current is detected.

16. The method of claim 10, comprising:

comparing a drain voltage and a source voltage of the respective one of the low-side transistors at the digital drive circuitry; and outputting a signal from the digital drive circuitry to cause the respective one of the low-side transistors to switch off when the drain voltage is larger than the source voltage by at least a second voltage offset.

17. The method of claim 10, wherein respective ones of the high-side gate drivers include digital drive circuitry, and the method comprises driving a respective one of the high-side transistors to switch on and off, by the digital drive circuitry, based on forward current through the respective one of the high-side transistors.

18. The method of claim 17, comprising:

comparing a source voltage and a drain voltage of the respective one of the high-side transistors at the digital drive circuitry; and outputting a switching signal from the digital drive circuitry to cause the respective one of the high-side transistors to switch on when the source voltage is larger than the drain voltage, the switching signal output when the source voltage is larger than the drain voltage by at least a second voltage offset.

\* \* \* \* \*